United States Patent [19]

Takeshima

[11] Patent Number: 5,495,100
[45] Date of Patent: Feb. 27, 1996

[54] PHASE DIFFERENCE DETECTING METHOD, CIRCUIT AND APPARATUS

[75] Inventor: Akira Takeshima, Hamamatsu, Japan

[73] Assignee: Hamamatsu Photonics, K.K., Hamamatsu, Japan

[21] Appl. No.: 280,878

[22] Filed: Jul. 26, 1994

[30] Foreign Application Priority Data

Jul. 27, 1993 [JP] Japan ................... 5-185113

[51] Int. Cl.⁶ ................ G02F 1/00; G01J 9/00
[52] U.S. Cl. ................ 250/214 R; 324/96
[58] Field of Search ............. 250/214 R, 214 L, 250/214 SW, 206, 201.9, 201.1; 324/96, 76.52, 76.53; 327/4, 3, 2, 514

[56] References Cited

U.S. PATENT DOCUMENTS

| | | | |
|---|---|---|---|
| 3,875,402 | 4/1975 | Parkin | 250/214.1 |
| 5,117,118 | 5/1992 | Fukuyama | 250/214 R |
| 5,256,968 | 10/1993 | Loualiche et al. | 324/96 |
| 5,381,230 | 1/1995 | Blake et al. | 356/345 |

FOREIGN PATENT DOCUMENTS

| | | |
|---|---|---|
| 22693 | 1/1990 | Japan . |
| 311670 | 1/1991 | Japan . |
| 3104175 | 5/1991 | Japan . |
| 480974 | 3/1992 | Japan . |
| 595131 | 4/1993 | Japan . |

OTHER PUBLICATIONS

Sugeta et al, "Metal–Semiconductor–Metal Photodetector for High–Speed Optoelectronic Circuits", Japanese Journal Of Applied Physics, vol. 19 (1980) Supplement 19–1, pp. 459–464.

Ito et al, "Low Dark Current GaAs Metal–Semiconductor–Metal (MSM) Photodiodes Using $WSi_x$ Contacts", IEEE Journal Of Quantum Electronics, vol. QE–22, No. 7, Jul. 1986, pp. 1073–1077.

Brown et al, "Measurements of Optical–Heterodyne Conversion in Low–Temperature–Grown GaAs", Applied Physics Letter 62 (11), Mar. 15, 1993, pp. 1206–1208.

Yoshida et al, "Ultra–High Speed Silicon Switch For Prepulse Measurement of Laser Light", pp. 489(21)–495(27) Applied Physics, vol. 50, No. 5, 1981.

*Primary Examiner*—Edward P. Westin
*Assistant Examiner*—John R. Lee
*Attorney, Agent, or Firm*—Cushman Darby & Cushman

[57] ABSTRACT

In phase difference detecting method, circuit, and apparatus of the present invention, a voltage signal having a predetermined frequency is applied to a photoconductive light-receiving device, and an optical signal is received by this photoconductive light-receiving device. A current generated upon reception of light and flowing in the photoconductive light-receiving device reflects a product value of the voltage signal and the optical signal, and contains a DC component according to a phase difference between the voltage signal and the component of the optical signal having the same intensity modulation frequency as that of the voltage signal. A time average value of the current flowing in the photoconductive light-receiving device or a voltage value obtained upon conversion of this current is generated, and only the DC component is extracted, thereby detecting the phase difference between the voltage signal and the component of the optical signal having the same intensity modulation frequency as that of the voltage signal.

10 Claims, 15 Drawing Sheets

BASIC ARRANGEMENT

Φ: PHASE DIFFERENCE
A: VOLTAGE SIGNAL AMPLITUDE
B: INCIDENT LIGHT INTENSITY 1
C: INCIDENT LIGHT INTENSITY 2

Φ : PHASE DIFFERENCE
A : VOLTAGE SIGNAL
    AMPLITUDE
Io : INCIDENT LIGHT
    INTENSITY AVERAGE
    VALUE
B : INCIDENT LIGHT
    INTENSITY MODULATED
    AMPLITUDE

MSM CHARACTERISTICS 1

MSM CHARACTERISTICS 2

MSM CHARACTERISTICS 3

PHASE DIFFERENCE OUTPUT

PHASE DIFFERENCE DETECTING METHOD, CIRCUIT AND APPARATUS

BACKGROUND OF THE INVENTION

1. Field of the Invention

The present invention relates to a method, circuit, and apparatus for detecting a phase difference between an optical signal and an electrical signal.

2. Related Background Art

A lot of PLL (Phase-Lock Loop) devices (phase comparator) and DBMs (Double-Balanced Mixers), both of which output a phase difference between two electrical signals, are commercially available as component devices. These component devices operate and output the phase differences between the electrical signals. For this reason, when a phase difference between a component of an intensity-modulated light and an electrical signal is measured, the optical signal must be converted into an electrical signal to measure the phase difference. Additionally, in these component devices, variations in intensity of an input electrical signal accordingly cause variations in phase difference output. Therefore, these component devices substantially need to be used at a constant input intensity.

As a phase difference detecting apparatus, a lock-in amplifier for outputting amplitude and phase difference information, a vector voltmeter mainly used in a high-frequency region, or a phase meter for outputting only a phase difference is known. These apparatuses are constituted to obtain an accurate phase difference even when the input intensity varies to some extent. In these apparatuses, however, when a phase difference between a light intensity-modulated component and an electrical signal is to be measured, the optical signal must be converted into an electrical signal (in some cases, the electrical signal is also amplified by an amplifier). Thereafter, the phase difference is measured. In this case, phase conditions must be sufficiently taken into consideration to constitute the apparatus.

SUMMARY OF THE INVENTION

It is an object of the present invention to easily and precisely obtain a phase difference between an optical signal and an electrical signal.

In a phase difference detecting method of the present invention, a product of an electrical signal and a light intensity-modulated signal, both of which have the same frequency, is directly operated, and the signals are then converted into a signal which reflects a phase difference. That is, the phase difference detecting method of the present invention comprises (a) the first step of applying a voltage signal which reflects a waveform of an electrical signal having a first frequency to a photoconductive light-receiving device, (b) the second step of receiving an optical signal modulated with the first frequency by the photoconductive light-receiving device to which the voltage signal is applied, and (c) the third step of operating a time average value of a current flowing in the photoconductive light-receiving element in accordance with a product value of the electrical signal and the optical signal and outputting a signal which reflects an arithmetic product operation result. The photoconductive light-receiving device has first and second terminals for applying the voltage signal. In the photoconductive light-receiving device, a resistance between the first and second terminals changes in accordance with an intensity of received light, and a voltage value at the second terminal can be set to a positive or negative value with reference to the first terminal.

The third step can comprise ① the fourth step of converting the value of the current flowing in the photoconductive light-receiving element into a voltage value, and ② the fifth step of generating a time average of the voltage value.

It is preferable that ① in the photoconductive light-receiving element, assuming that an incident light intensity is constant and an applying voltage is an independent variable, an amount of current flowing in the photoconductive light-receiving device represents a substantially odd function of the applying voltage within a predetermined definition range of the applying voltage value including 0 V, and assuming that the applying voltage is constant and the incident light intensity is an independent variable, the current amount flowing in the photoconductive light-receiving devices represents a substantially linear function of the incident light intensity within a predetermined definition range of the incident light intensity, and ② a voltage signal applied to the photoconductive light-receiving element is a periodic signal having a time average value of almost zero, and an amplitude of the voltage signal represents an even function of time when the origin is set at a central point between adjacent times where the amplitude becomes zero.

A phase difference detecting circuit of the present invention comprises (a) a photoconductive light-receiving device in which an external input voltage signal is connected to first and second terminals, (b) a current-to-voltage conversion circuit for converting the value of a current flowing in the photoconductive light-receiving device into a voltage value, and (c) a time averaging circuit for receiving a voltage signal output from the current-to-voltage conversion circuit to generate a time average value. In the photoconductive light-receiving device, a resistance between the first and second terminals changes in accordance with the intensity of received light, and a voltage value at the second terminal can be set to a positive or negative value with reference to the first terminal. The circuit can also comprise a bias adjustment circuit for adjusting an operating bias voltage to the photoconductive light-receiving device.

It is preferable that, in the photoconductive light-receiving device, assuming that an incident light intensity is constant and an applying voltage is an independent variable, an amount of current flowing in the photoconductive light-receiving device represents a substantially odd function of the applying voltage within a predetermined definition range of the applying voltage value including 0 V, and assuming that the applying voltage is constant and the incident light intensity is an independent variable, the amount of current flowing in the photoconductive light-receiving device represents a substantially linear function of the incident light intensity within a predetermined definition range of the incident light intensity. As a photoconductive light-receiving element having these properties, a photodetector having a metal-semiconductor-metal structure can be used.

The time averaging circuit can comprise ① a current-to-voltage conversion circuit for receiving an output current from the photoconductive light-receiving device and converting the input current into a voltage according to the current value, and ② a voltage averaging circuit for receiving a voltage signal output from the current-to-voltage conversion circuit to calculate a time average of the voltage signal value.

A phase difference detecting apparatus of the present invention comprises (a) the above phase difference detecting circuit, and (b) a voltage applying means for receiving an electrical signal having a modulation frequency of an optical signal input to a photoconductive light-receiving element to apply an applying voltage which reflects a waveform of the electrical signal to the photoconductive light-receiving device.

It is preferable that, ① in the photoconductive light-receiving element, assuming that an incident light intensity is constant and an applying voltage is an independent variable, an amount of current flowing in the photoconductive light-receiving device represents a substantially odd function of the applying voltage within a predetermined definition range of the applying voltage value including 0 V, and assuming that the applying voltage is constant and the incident light intensity is an independent variable, the amount of current flowing in the photoconductive light-receiving device represents a substantially linear function of the incident light intensity within a predetermined definition range of the incident light intensity, and ② the applying voltage applied by the voltage applying means is a periodic signal having a time average value of almost zero, and an amplitude of the applying voltage represents an even function of time when the origin is set at a central point between adjacent times where the amplitude becomes zero.

In the phase difference detecting method, circuit, and apparatus of the present invention, a voltage signal having a predetermined frequency is applied to the photoconductive light-receiving device, and an optical signal is received by this photoconductive light-receiving device. A current generated upon reception of light and flowing in the photoconductive light-receiving device reflects a product value of the voltage signal and the optical signal, and contains a DC component according to a phase difference between the voltage signal and the component of the optical signal having the same intensity modulation frequency as that of the voltage signal. A time average value of the current flowing in the photoconductive light-receiving device or a voltage value obtained upon conversion of this current is arithmetically operated, and only the DC component is extracted, thereby detecting the phase difference between the voltage signal and the component of the optical signal having the same intensity modulation frequency as that of the voltage signal.

According to the phase difference detecting method, circuit, and apparatus of the present invention, the product of the voltage signal and the optical signal is directly generated by the photoconductive light-receiving device, and a value obtained upon time-averaging the generated product is measured, thereby detecting a phase difference. Therefore, a phase difference between an optical signal and an electrical signal can be easily and precisely detected.

In addition, when the phase difference detecting method, circuit, and apparatus of the present invention are applied to an optical distance measuring instrument, a high-frequency amplifier which is difficult to handle need not be used. Since a decrease in distance measurement accuracy due to sneak of a high-frequency signal can be prevented, distance measurement can be performed with high accuracy.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

Figure 1:
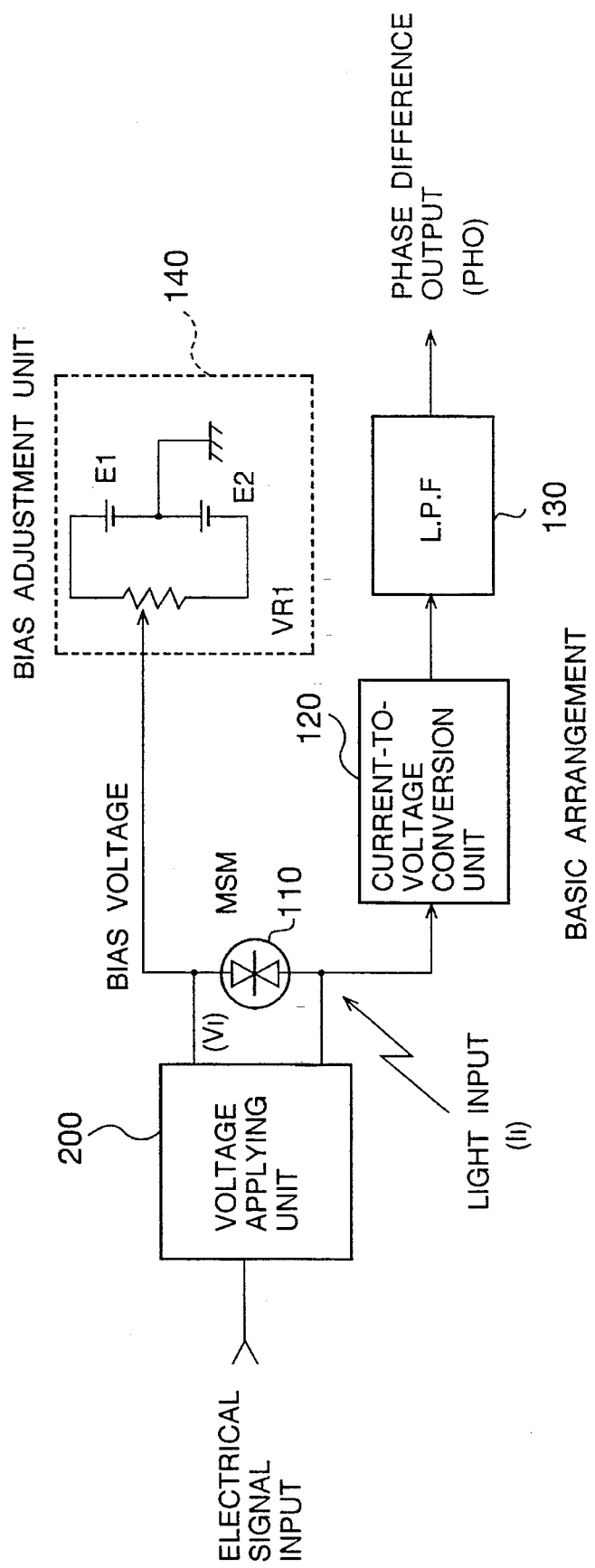
FIG. 1 is a diagram showing the basic arrangement of the present invention.

An embodiment of the present invention will be described below with reference to the accompanying drawings. The same reference numerals and symbols throughout the drawings denote the same elements, and a detailed description thereof will be omitted.

FIG. 1 is a diagram showing the basic arrangement of the main part of a phase difference detecting apparatus of the present invention. As shown in FIG. 1, the main part of this apparatus is constituted by a photoconductive light-receiving device 110, a voltage applying unit 200, a current-tovoltage conversion unit 120, a low-pass filter (LPF) 130, and a bias adjustment unit 140. The voltage applying unit 200 applies a voltage according to an input electrical signal to the photoconductive light-receiving element 110. The current-to-voltage conversion unit 120 receives a current generated in accordance with the applying voltage and the light-receiving amount and flowing in the photoconductive light-receiving device 110 and converts the current value into a voltage value. The low-pass filter 130 generates the time average of the voltage signal output from the current-to-voltage conversion unit 120 and outputs a DC component value. The bias adjustment unit 140 sets the operation of the photoconductive light-receiving device 110 such that an output current value becomes zero with respect to DC incident light such as background light.

As the photoconductive light-receiving device 110, a metal-semiconductor-metal (MSM) photodetector or the like is used. In this photodetector, an amount of current flowing in the photoconductive light-receiving device represents a substantially odd function of the applied voltage.

An embodiment of a phase difference detecting method of the present invention will be described below with reference to FIG. 1.

(First Embodiment of Phase Difference Detecting Method (both signals are rectangular wave signals having the same period.))

Figure 2A:
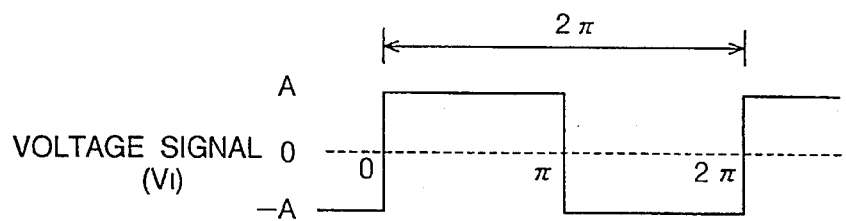
FIGS. 2A, 2B and 3 are charts for explaining the first embodiment (rectangular wave input) of a phase difference detecting method of the present invention.
Figure 2B:
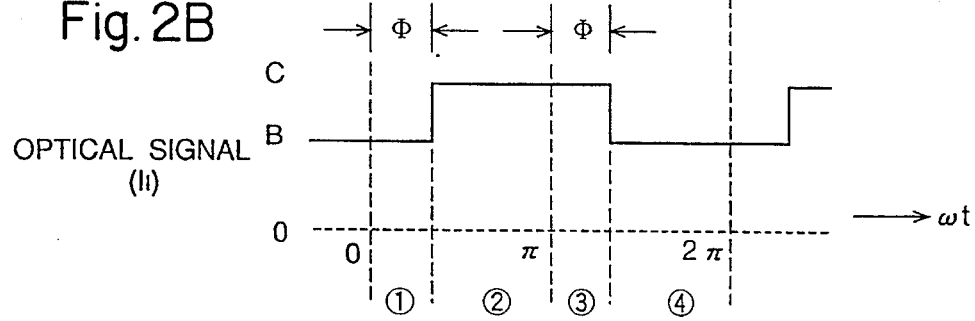
Figure 3:
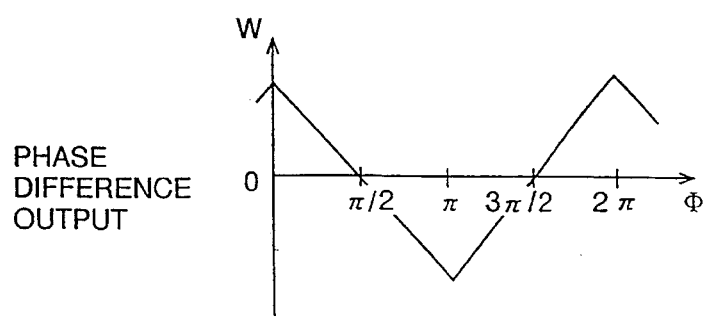

FIGS. 2A, 2B and 3 are explanatory charts of this embodiment. FIG. 2A and 2B are charts showing input signals, i.e., a voltage signal ($V_I$) and an optical signal intensity ($I_I$) to the photoconductive light-receiving element 110 in this embodiment. As shown in FIG. 2A and 2B, the signals $V_1$ and $I_I$ are periodic. Within one period ($0 < \omega t < 2\pi$), when a phase difference satisfies $\Phi \leq \pi$, the signals $V_I$ and $I_I$ are represented by the following equations.

$$V_I = \begin{cases} A \ (0 < \omega t < \pi) \\ -A \ (\pi < \omega t < 2\pi) \end{cases} \quad (1)$$

$$I_I = \begin{cases} B \ (0 < \omega t < \Phi, \pi + \Phi < \omega t < 2\pi) \\ C \ (\Phi < \omega t < \pi + \Phi) \end{cases} \quad (2)$$

where

A: voltage signal amplitude

B: incident light intensity 1

C: incident light intensity 2

The photoconductive light-receiving device 110 generates a current according to a product value of the signals $V_I$ and $I_I$ at each time. Assume that one period is divided into intervals ① to ④ as in FIGS. 2A and 2B. In this case, output voltage values W1 to W4 from the current-to-voltage conversion unit 120 in these intervals are represented as follows.

$$W1 = K1.K2.K3.A.B \quad (3)$$

$$W2 = K1.K2.K3.A.C \quad (4)$$

$$W3 = .K1.K2.K3.A.C \quad (5)$$

$$W4 = .K1.K2.K3.A.B \quad (6)$$

where

K1: proportional constant of the output current with respect to the applied voltage to the photoconductive light-receiving device K2: proportional constant of the output current with respect to the input light intensity of K3: conversion constant of the current-to-voltage conversion unit.

Therefore, a phase difference output (PHO) value W from the low-pass filter 130 is represent as follows.

$$\begin{aligned} W &= (W1 \cdot \Phi + W2 \cdot (\pi - \Phi) + \\ &\quad W3 \cdot \Phi + W4 \cdot (\pi - \Phi))/2\pi \\ &= K1 \cdot K2 \cdot K3 \cdot A(B - C)(1/2 - \Phi/\pi) \end{aligned} \quad (7)$$

Similarly, when the phase difference is $\pi < \Phi < 2\pi$, the value W is represented as follows.

$$W = K1.K2.K3.A(B-C)(\Phi/\pi - 3/2) \quad (8)$$

That is, the phase difference output (PHO) value W polygonally changes with respect to the phase difference $\Phi$, and becomes zero when $\Phi = \pi/2$ or $\Phi = 3\pi/2$ (FIG. 3). Therefore, when the phase difference $\Phi$ is set to change within a range of $2n\pi \leq \Phi \leq (2n+1)\pi$ or $(2n-1)\pi \leq \Phi \leq 2n\pi$ (n: integer), the phase difference can be detected from the phase difference output (PHO) value W.

Figure 4A:
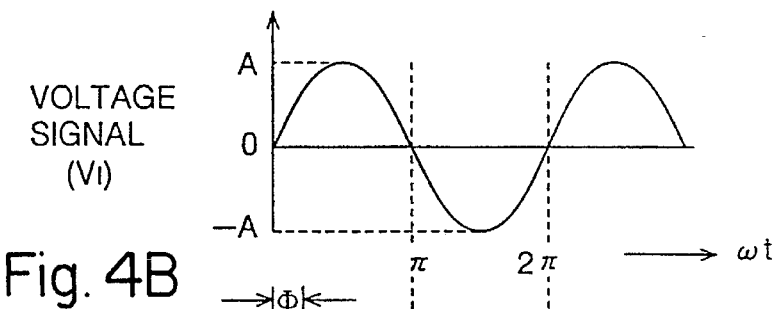
FIGS. 4A, 4B and 5 are charts for explaining the second embodiment (sine wave input) of the phase difference detecting method of the present invention.
Figure 4B:
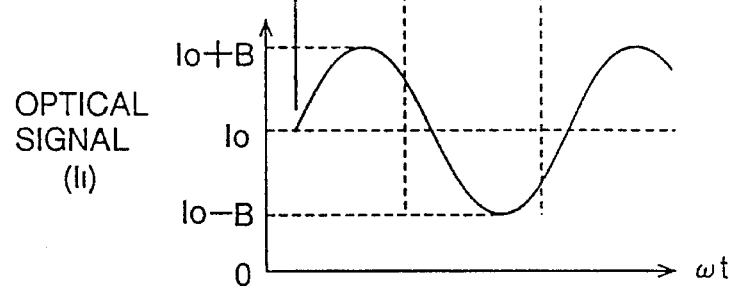
Figure 5:
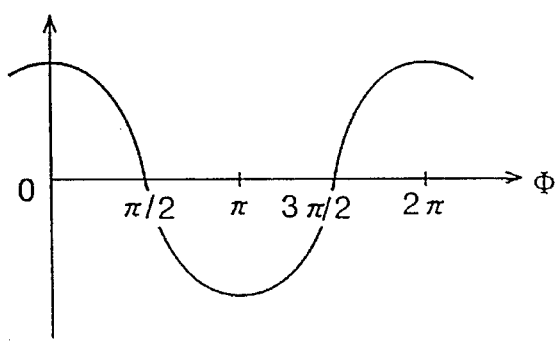

(Second Embodiment of Phase Difference Detecting Method (both signals are sine wave signals having the same period.)) FIGS. 4A, 4B and 5 are explanatory charts of the second embodiment. FIGS. 4A and 4B are charts showing input signals, i.e., a voltage signal ($V_I$) and an optical signal ($I_I$) to a photoconductive light-receiving element 110 in this embodiment. As shown in FIGS. 4A and 4B, the signals $V_I$ and $I_I$ are periodic. Within one period ($0 < \omega t < 2\pi$), when a phase difference satisfies $\Phi < \pi$, the signals $V_I$ and $I_I$ are represented by the following equations.

$$V_I = A.\sin \omega t \quad (9)$$

$$I_I = B.\sin (\omega t - \Phi) + I_O \quad (10)$$

where $\omega$: angular frequency

As in the above first embodiment, the photoconductive light-receiving element 110 generates a current according to a product value of the signals $V_I$ and $I_I$ at each time. An output voltage value w from a current-to-voltage conversion unit 120 at each time is represented as follows.

$$\begin{aligned} w &= K1 \cdot K2 \cdot K3 \cdot V_I \cdot I_I \\ &= K1 \cdot K2 \cdot K3 \cdot A(B\sin\omega t \cdot \sin(\omega t - \Phi) + I_O \sin\omega t) \end{aligned} \quad (11)$$

Therefore, a phase difference output (PHO) value W from a low-pass filter 130 is represented by the following equation.

$$\begin{aligned} W &= \frac{1}{2\pi} \int_0^{2\pi} w d\theta \ (\theta:\omega t) \\ &= \frac{1}{2} K1 \cdot K2 \cdot K3 \cdot A \cdot B \cdot \cos\Phi \end{aligned} \quad (12)$$

That is, the phase difference output (PHO) value W changes along a cosine curve with respect to the phase difference $\Phi$ and becomes zero when $\Phi = \pi/2$ or $\Phi = 3\pi/2$ (FIG. 5). When the phase difference $\Phi$ is set to change within a range of $2n\pi \leq \Phi \leq (2n+1)\pi$ (n: integer) or $(2n-1)\pi \leq \Phi \leq 2n\pi$ (n: integer), the phase difference can be detected from the phase difference output (PHO) value W.

The typical embodiments of the phase detecting method of the present invention have been described above. The waveforms of the voltage and optical signals subjected to the phase difference detection are not limited to the above-described rectangular or sine wave. As far as it is a periodic signal having a time average value of almost zero, and its amplitude represents an even function of time when the origin is set at an intermediate point between the adjacent times where the amplitude becomes zero, the phase detecting method of the present invention can be performed. For example, a triangular wave shown in FIG. 6, or a trapezoidal wave shown in FIG. 7 can also be used. The voltage and optical signals need not have a waveform of the same type. As far as both the signals have the same period and a time average value of almost zero, and their amplitudes represent an even function of time when the origin is set at an intermediate point between the adjacent times where the amplitude becomes zero, the phase detecting method of the present invention can be performed.

Figure 8:
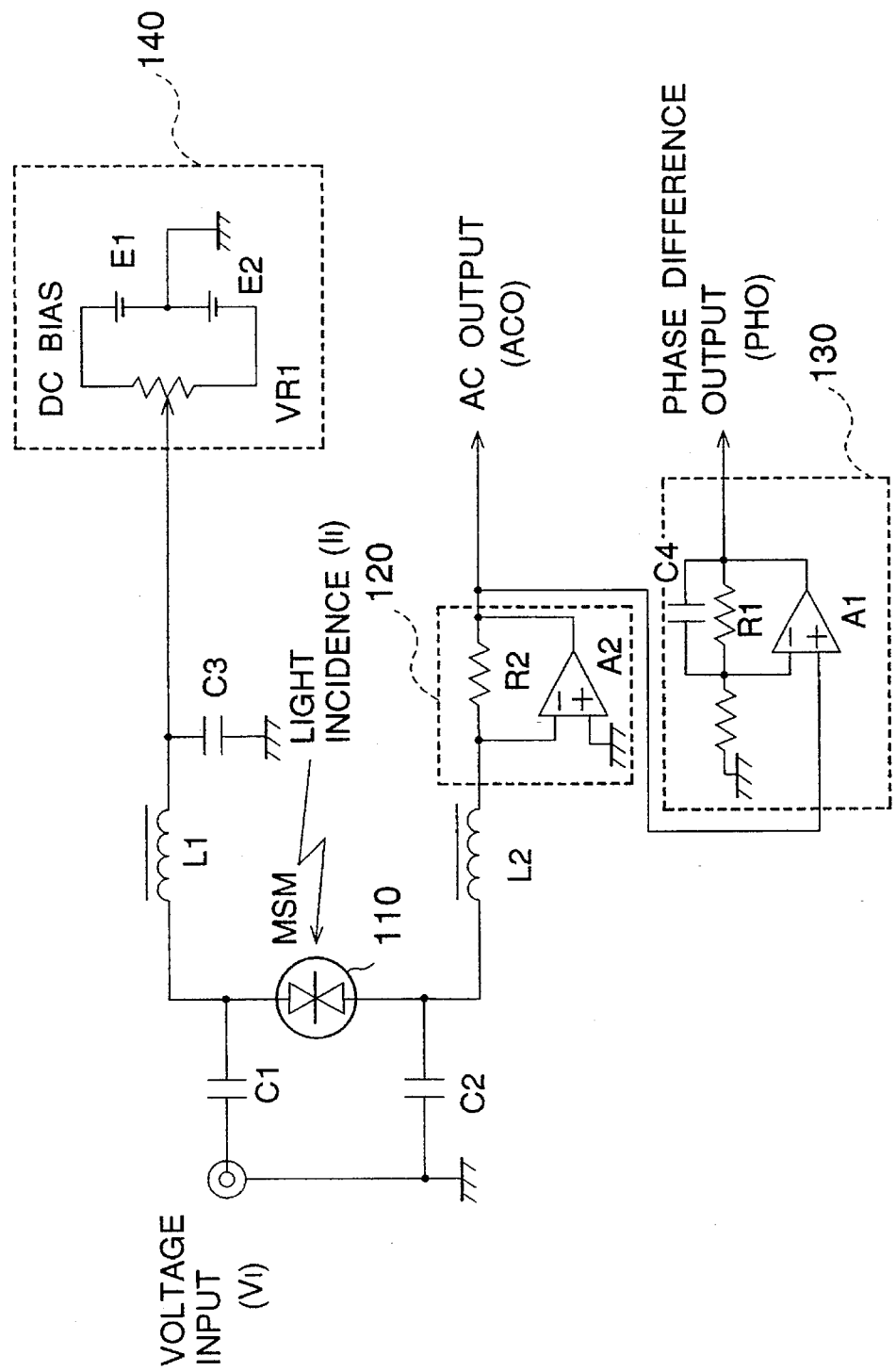
FIG. 8 is a diagram showing the first arrangement of a phase difference detecting circuit of the present invention.

An embodiment of a phase difference circuit for realizing the above phase difference detecting method will be described below. FIG. 8 is a diagram showing the first arrangement of a phase difference detecting circuit. This phase difference detecting circuit is constituted by a photoconductive light-receiving device 110, connection capacitors C1 and C2, choke coils L1 and L2, a current-to-voltage conversion circuit 120, a low-pass filter 130, and a bias adjustment circuit 140. The photoconductive light-receiving device 110 receives an optical signal ($I_I$) and a voltage signal ($V_I$) to arithmetically operate a product of the optical and voltage signals, thereby outputting a current signal which reflects a phase difference between reflected modulated light and a modulated signal. The connection capacitors C1 and C2 apply the voltage signal of the AC component of the voltage signal to the photoconductive light-receiving device 110. The choke coils L1 and L2 pass the DC component of a current generated in the photoconductive light-receiving device 110. The current-to-voltage conversion circuit 120 converts the AC component of the current signal flowing in the photoconductive light-receiving device 110 and the choke coils L1 and L2 into a voltage. The low-pass filter 130 arithmetically operates and outputs the time average of the voltage signal output from the current-to-voltage conversion circuit 120. The bias adjustment circuit 140 adjusts the bias value of the voltage applied to the photoconductive light-receiving device 110.

Figure 9:
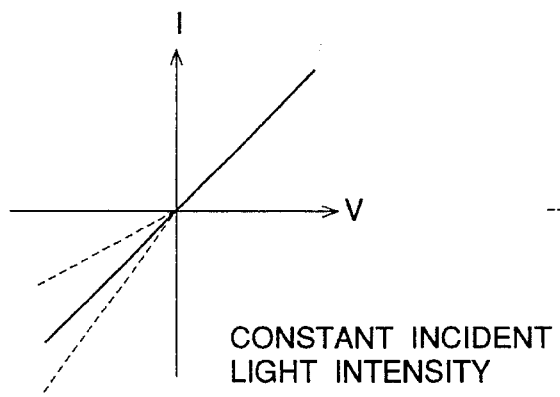
FIGS. 9 to 11 are graphs for explaining the characteristics of a photoconductive light-receiving device.
Figure 10:
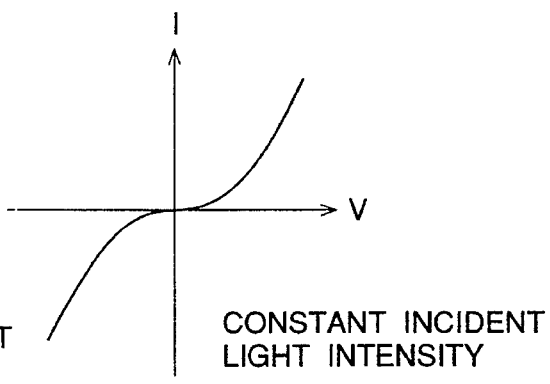
Figure 11:
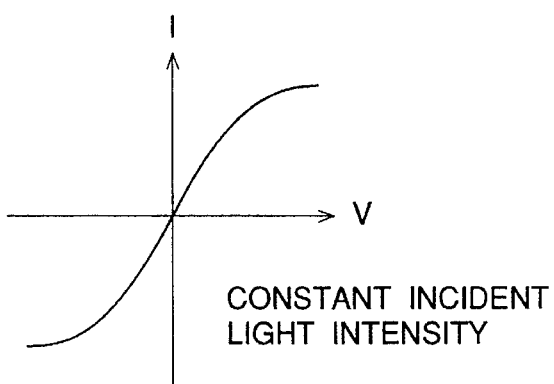

The photoconductive light-receiving device 110 is constituted by a metal-semiconductor-metal (MSM) sensor consisting of GaAs. Assume that an incident light intensity is constant and an applying voltage value is an independent variable. In this case, the photoconductive light-receiving device 110 has characteristics in which a current amount flowing in the photoconductive light-receiving device represents an odd function of the applying voltage within a predetermined definition range including an applying voltage value of 0 V. FIGS. 9 to 11 are graphs exemplifying the characteristics of the photoconductive light-receiving device which can be applied to the phase difference detecting circuit of this embodiment.

The current-to-voltage conversion circuit 120 is constituted by an operational amplifier A2 and a resistor R2. An input AC current signal is converted into a voltage by the resistor R2, and a voltage signal is output.

The low-pass filter 130 is constituted by an operational amplifier A1, a capacitor C4, and a resistor R1. The low-pass filter 130 integrates the input voltage signal by a time constant defined by a product of the capacitance of the capacitor C4 and the resistance of the resistor R1 to arithmetically operate the time average value, thereby outputting a substantially DC voltage according to the phase difference.

The bias adjustment circuit 140 is constituted by a variable resistor VR1 for adjusting a bias voltage value and DC power supplies E1 and E2 which are connected to the terminals of the variable resistor VR1 and also connected in series with each other. The connecting point between the DC power supplies E1 and E2 is set to the ground potential.

In the circuit of this embodiment, the AC component of a voltage signal input from a voltage applying unit 200 is applied to the photoconductive light-receiving device 110. When an optical signal is incident on the photoconductive light-receiving device 110 to which the voltage is applied, a current according to the product value of the voltage and optical signals flows in the photoconductive light-receiving device 110. This current signal is input to the current-to-voltage conversion unit 120 through the choke coil L2, converted into a voltage signal (ACO), and output. This voltage signal contains an AC component which has not been completely removed by the choke coils L1 and L2. The low-pass filter receives the voltage signal and arithmetically operates the time average, thereby outputting a DC voltage (PHO). This DC voltage value coincides with the phase difference output (PHO) value W in the above phase difference detecting method. By the bias adjustment circuit 140, the phase difference output value is set to become "0 V" upon incidence of DC light such as background light. In this case, even if the current characteristic of the photoconductive light-receiving device 110 with respect to the applying voltage does not represent an odd function characteristic, as indicated by a broken line in FIG. 9, an output value of "0 V" can be obtained in the phase difference of $\Phi=\pi/2$ or $3\pi/2$.

Figure 12:
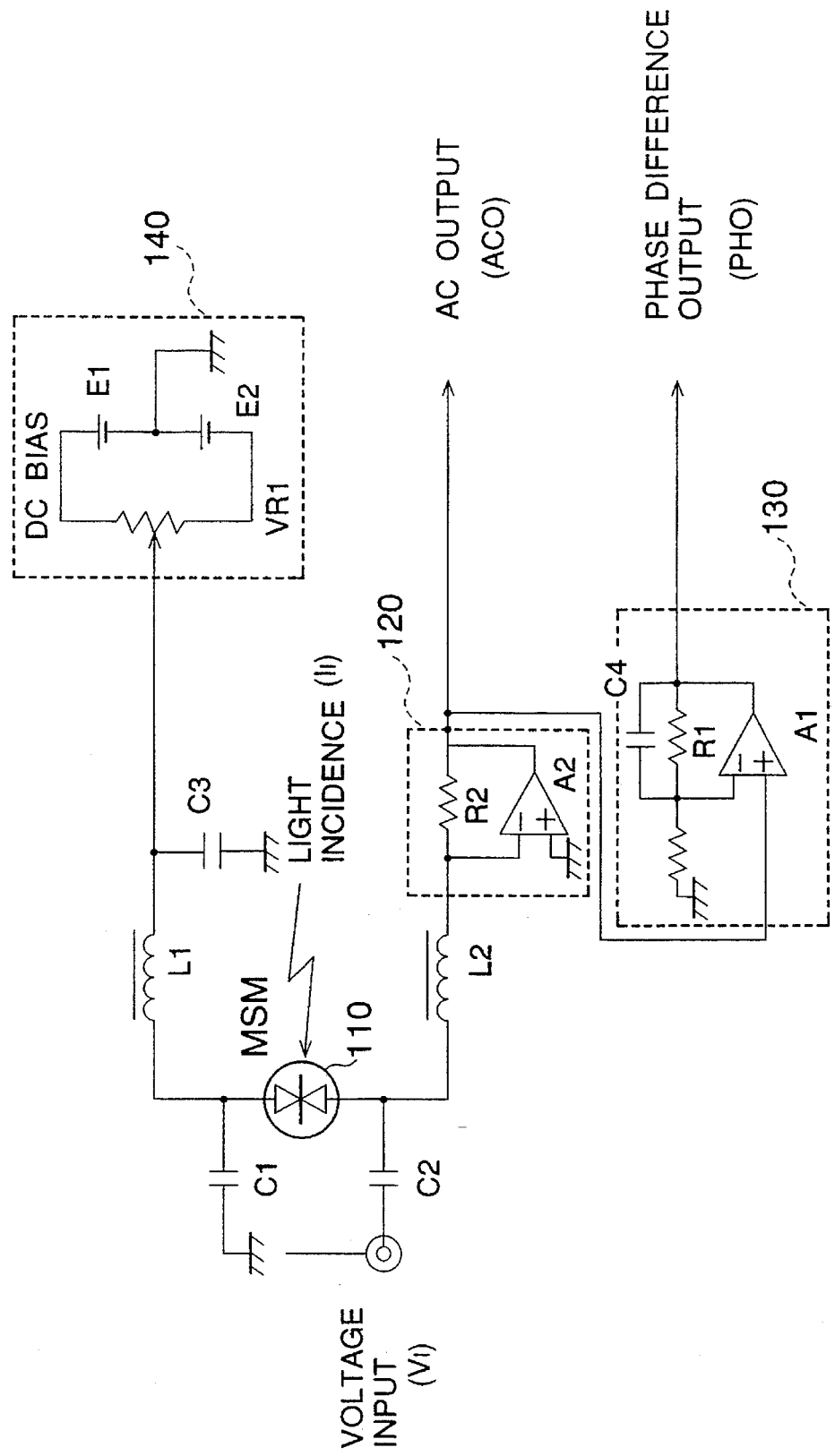
FIG. 12 is a diagram showing the second arrangement of the phase difference detecting circuit of the present invention.
Figure 13:
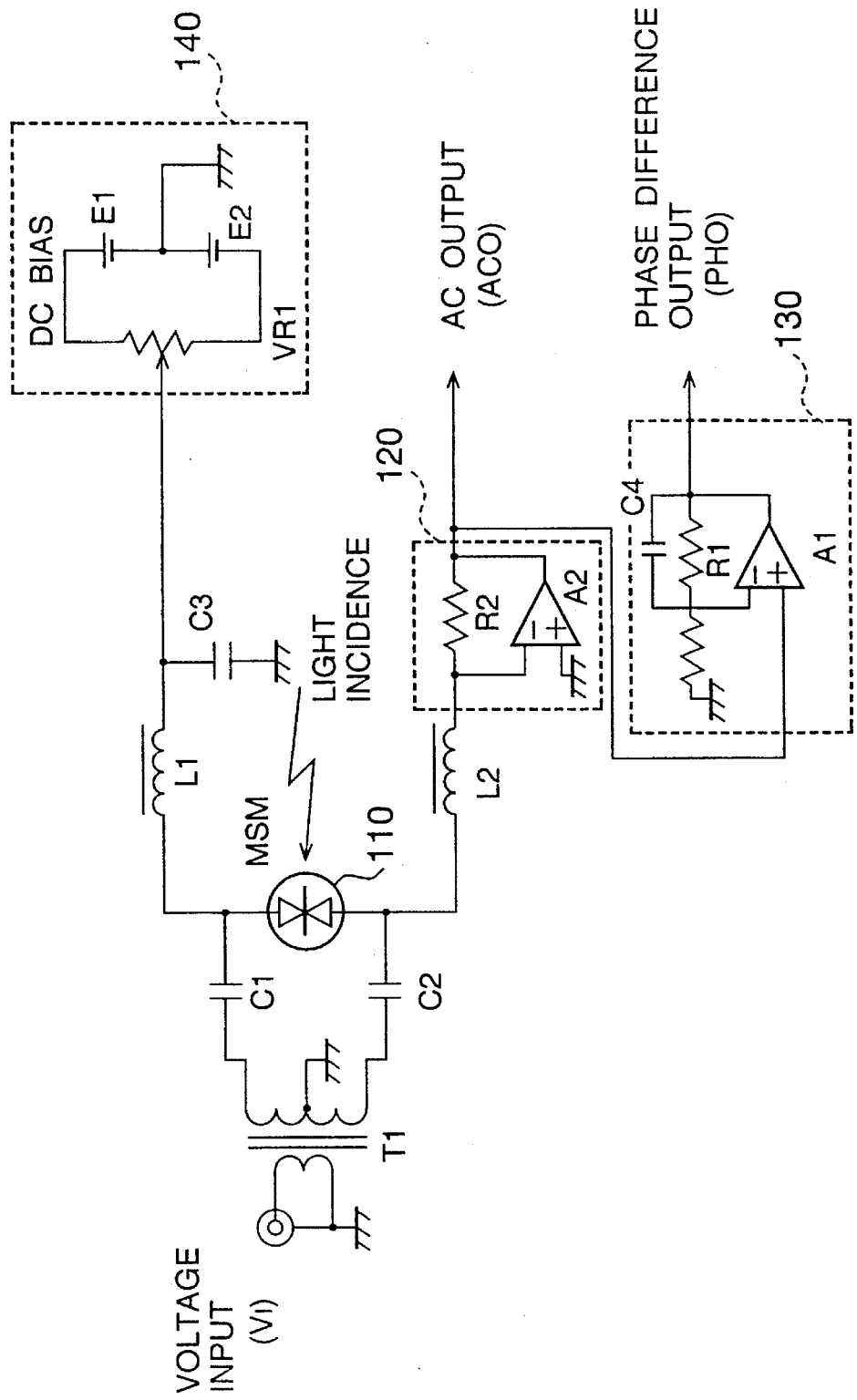
FIG. 13 is a diagram showing the third arrangement of the phase difference detecting circuit of the present invention.
Figure 14:
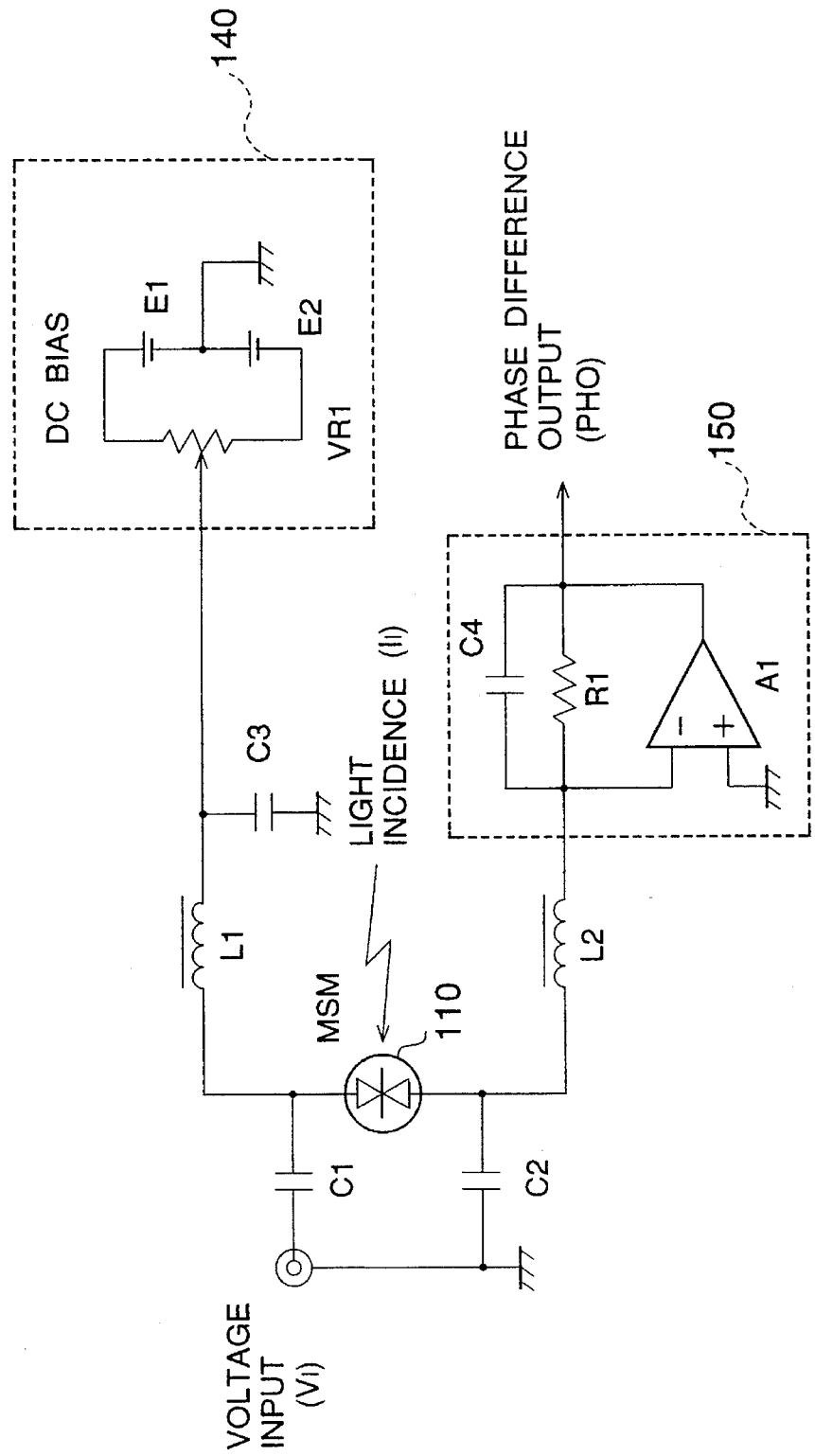
FIG. 14 is a diagram showing the fourth arrangement of the phase difference detecting circuit of the present invention.
Figure 15:
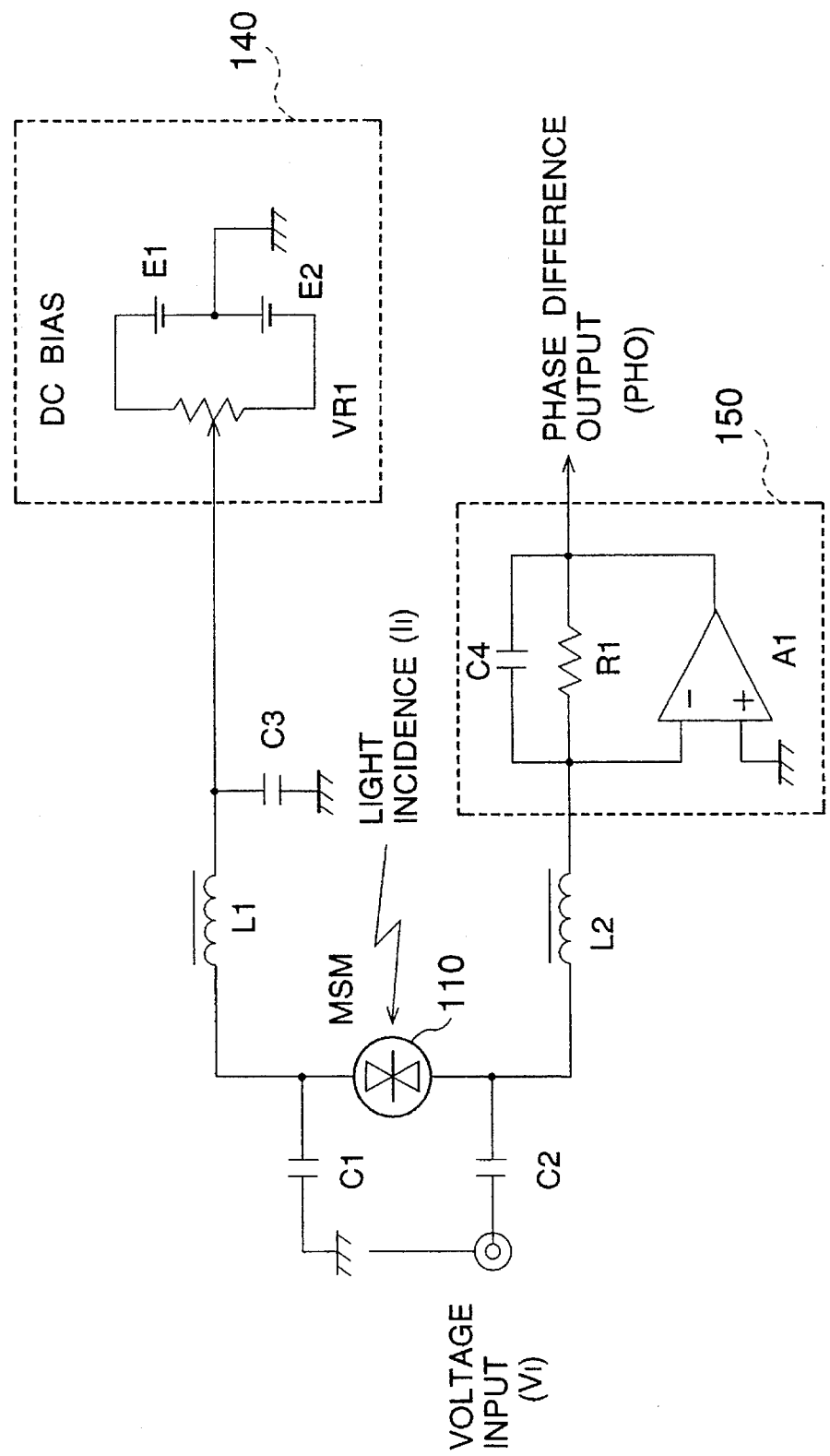
FIG. 15 is a diagram showing the fifth arrangement of the phase difference detecting circuit of the present invention.
Figure 16:
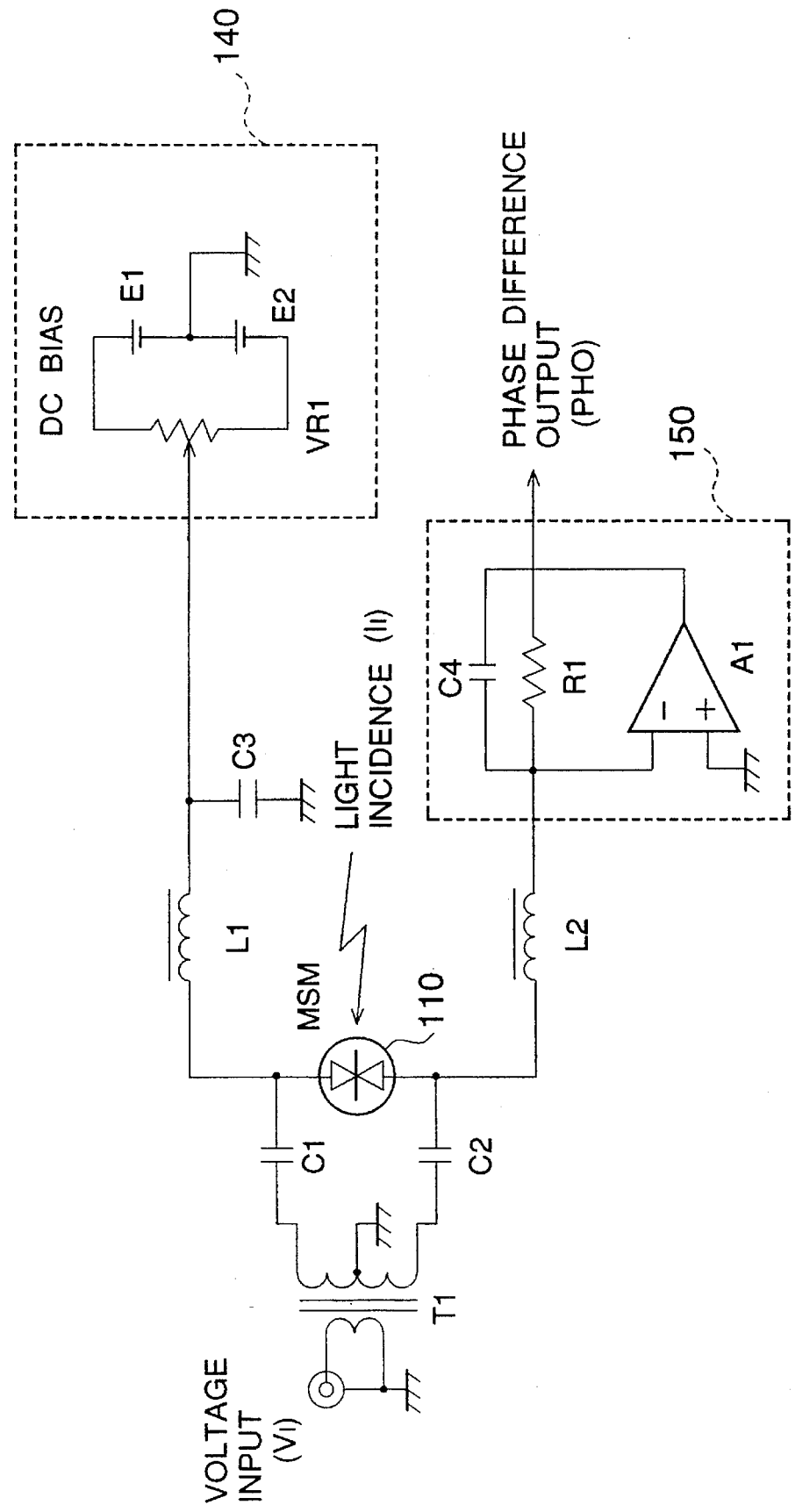
FIG. 16 is a diagram showing the sixth arrangement of the phase difference detecting circuit of the present invention.

Even when the voltage signal applying method of the arrangement in FIG. 8 is changed to the second arrangement of the phase difference detecting circuit shown in FIG. 12 or the third arrangement of the phase difference circuit shown in FIG. 13, a DC voltage output according to the phase difference can also be obtained. As shown in FIGS. 14 to 16, even when the current-to-voltage conversion circuit 120 and the low-pass filter 130 in FIGS. 8, 12, and 13 are integrally formed and replaced with a filter 150, a DC voltage output according to the phase difference can be obtained.

An embodiment of a phase difference detecting apparatus using the above phase difference detecting circuit will be described below.

(First Embodiment of Phase Difference Detecting Apparatus)

Figure 17:
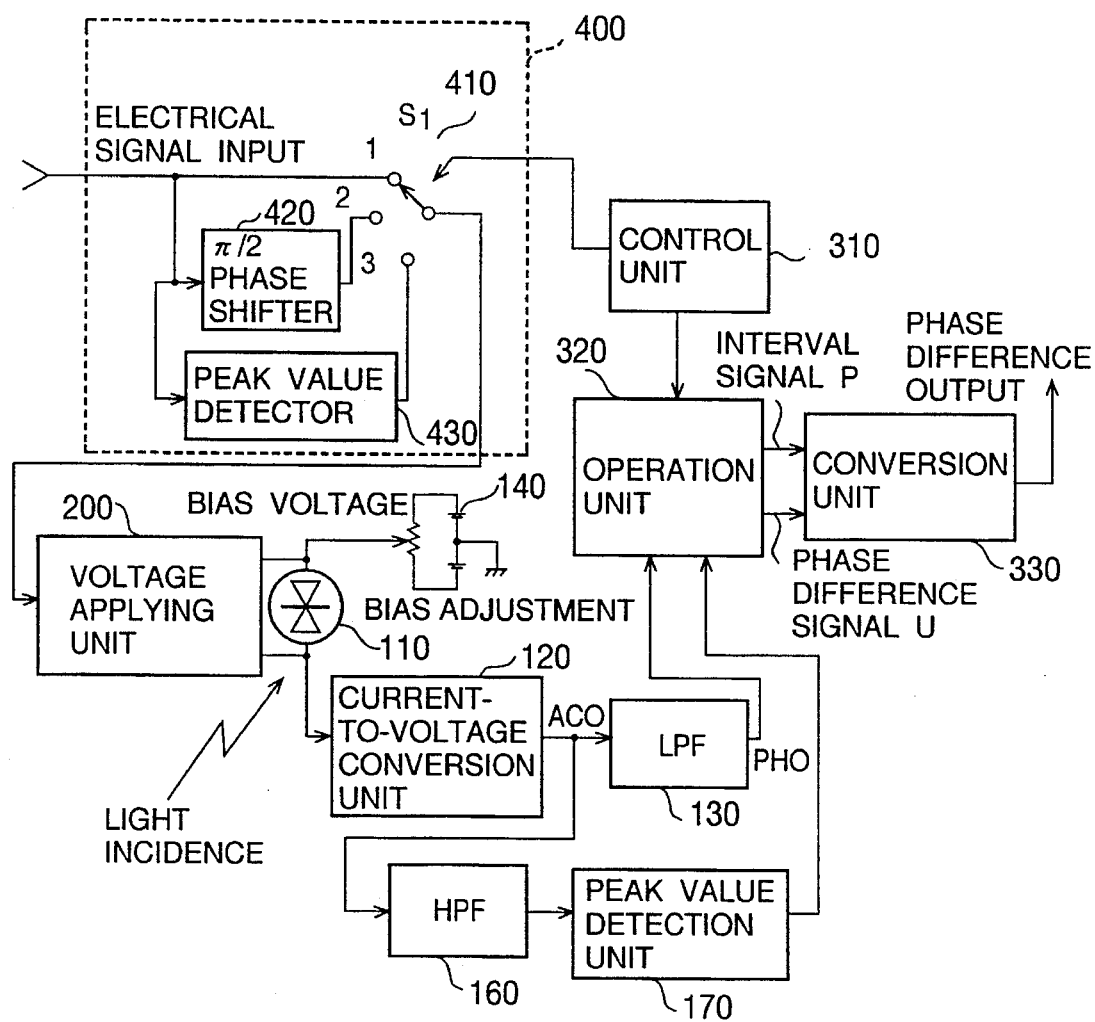
FIG. 17 is a diagram showing the first embodiment of a phase difference detecting apparatus of the present invention.

FIG. 17 is a diagram showing the first embodiment of a phase difference detecting apparatus of the present invention. The apparatus of this embodiment uses the phase difference detecting circuit in FIG. 8, 12, or 13. As shown in FIG. 17, this apparatus is constituted by, in addition to the basic arrangement shown in FIG. 1, (a) a signal selection unit 400, (b) a high-pass filter (HPF) 160, (c) a peak value detection unit 170, (d) a control unit 310, (e) an operation unit 320, and (f) a conversion unit 330. The signal selection unit 400 selects a signal to be input to a voltage applying unit 200. The high-pass filter 160 receives the signal output from the AC output terminal (ACO) of a current-to-voltage conversion unit 120 and outputs a signal after removal of a DC component. The peak value detection unit 170 receives the signal output from the high-pass filter 160 to measure a peak value. The control unit 310 performs selection designation to the signal selection unit 400. The operation unit 320 receives output signals from a low-pass filter 130 and the peak value detection unit 170 and outputs a normalized phase difference signal and an interval signal indicating the interval of a phase difference in accordance with selection designation from the control unit 310. The conversion unit 330 receives the normalized phase difference signal and the interval signal, converts these signals into a phase difference value, and outputs the phase difference signal unique to the phase difference.

The signal selection unit 400 is constituted by ① a phase shifter 420, ② a peak value detector 430, and ③ a switch 410. The phase shifter 420 shifts the phase of an input electrical signal by $\pi/2$. The peak value detector 430 measures the peak value of the input electrical signal. The switch 410 selects one of the input electrical signal (selection 1), an output signal from the phase shifter 420 (selection 2), and an output signal from the peak value detector 430 (selection 3) in accordance with selection designation from the control unit 310 and supplies the selected signal to the voltage applying unit 200.

A phase detection operation is performed by this apparatus as follows.

[Rectangular Wave Input (FIGS. 2 and 3)]

First of all, the control unit 310 notifies selection designation of selection 3 to the switch 410 and the operation unit 320. In this setting, an output value V from the high-pass filter 160 is represented by the following equation.

$$V = (1/2).K1.K2.K3.A(C-B) \tag{13}$$

The value V is the maximum value of the value W represented by equation (7) or (8). The operation unit 320 receives and stores this value V.

Figure 18:
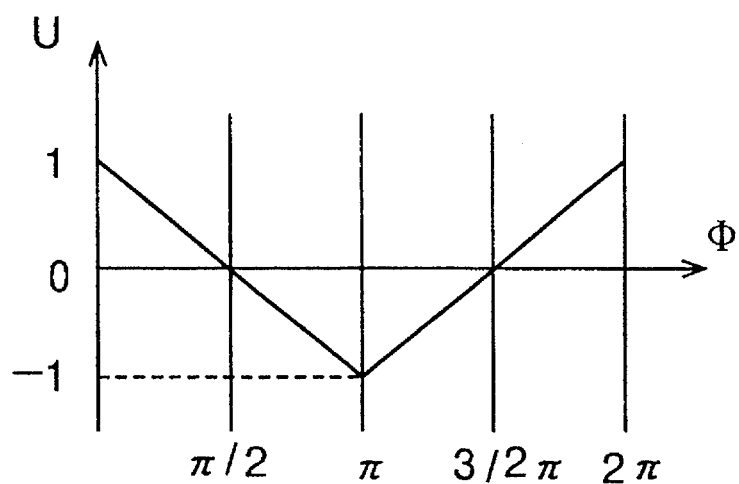
FIG. 18 is a chart for explaining a normalized phase difference signal upon reception of a rectangular wave.

The control unit 310 then notifies selection designation of selection 1 to the switch 410 and the operation unit 320. In this setting, an output value from the low-pass filter 130 is the value W represented by equation (7) or (8). The operation unit 320 receives the value W and divides the value W by the value V to output a normalized phase difference signal U. FIG. 18 is a graph showing a change in phase difference signal U with respect to a phase difference Φ. The phase difference signal U does not depend on the amplitude value of a voltage signal and the intensity value of an optical signal input to the photoconductive light-receiving element 110. For this reason, by using the phase difference signal U, a phase difference can be detected regardless of the amplitude value of the voltage signal and the intensity value of the optical signal input to the photoconductive light-receiving device 110.

As described above, when the phase difference changes within a range of 0 to π or π to 2π, a phase difference can be obtained uniquely from the value of the phase difference signal U.

Figure 19:
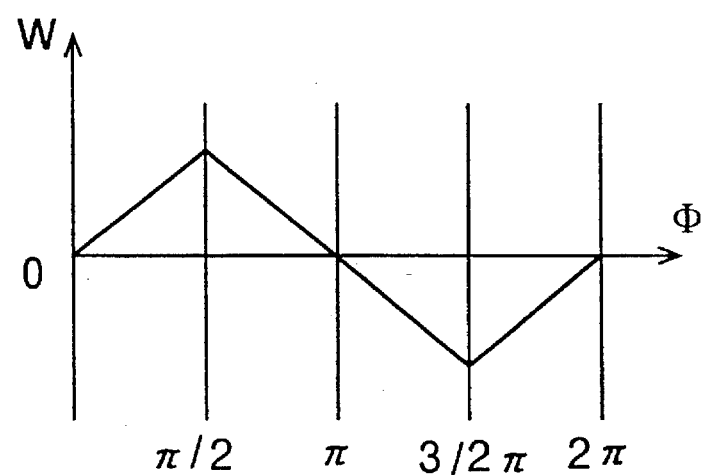
FIG. 19 is a chart for explaining the generation of an interval signal upon reception of the rectangular wave.
Figure 20:
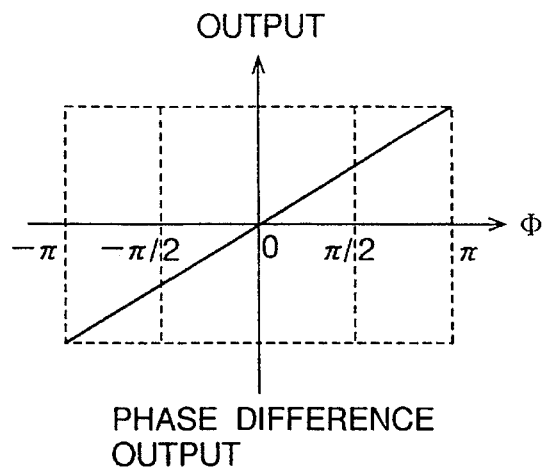
FIG. 20 is a chart for explaining a phase difference output.

However, when the phase difference changes within a range of 0 to 2π, two phase difference values can be obtained as candidates for one phase difference signal U. For this reason, a phase difference cannot be determined uniquely by only the above measurement operation. In this case, after the above measurement operation, the control unit 310 notifies selection designation of selection 2 to the switch 410 and the operation unit 320. In this setting, an output value from the low-pass filter 130 is obtained by replacing Φ in the value W represented by equation (7) or (8) with (Φ+π/2), as shown in a graph in FIG. 19. As is apparent from this graph, in a phase difference range of 0 to π, the value W becomes positive. In a phase difference range of π to 2π, the value W becomes negative. The operation unit 320 receives the value W and outputs the positive/negative state of the value W as an interval signal. The conversion unit 330 receives this positive/negative information and the phase difference signal U, converts them into a unique phase difference value, and outputs a phase difference output signal as shown in FIG. 20. Note that generation of an interval signal and the operation of the conversion unit 330 can also be applied even when the phase difference changes within a range of 0 to π or π to 2π.

[Sine Wave Input (FIGS. 4 and 5)]

In the apparatus of this embodiment, a phase difference can also be detected upon reception of a sine wave in the same manner as in reception of a rectangular wave.

The control unit 310 notifies selection designation of selection 3 to the switch 410 and the operation unit 320. In this setting, the output value V from the high-pass filter 160 is represented by the following equation.

$$V = (1/2).K1.K2.K3.A.B \tag{14}$$

The value V is the maximum value of the value W represented by equation (12). The operation unit 320 receives and stores this value V.

Figure 21:
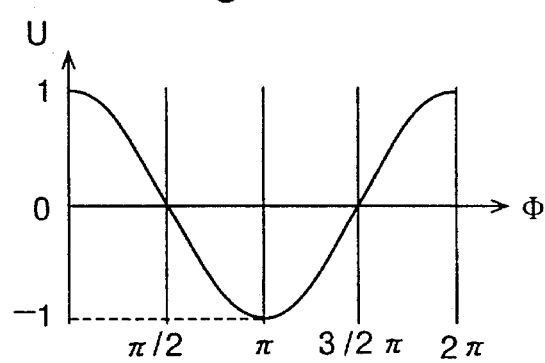
FIG. 21 is a chart for explaining normalized signal upon reception of a sine wave.

The control unit 310 notifies selection designation of selection I to the switch 410 and the operation unit 320. In this setting, an output value from the low-pass filter 130 is the value W represented by equation (12). The operation unit 320 receives the value W and divides the value W by the value V to output the normalized phase difference signal U. FIG. 21 is a graph showing a change in phase difference signal U with respect to the phase difference Φ. The phase difference signal U does not depend on the amplitude value of a voltage signal and the intensity value of an optical signal input to a photoconductive light-receiving element 110. For this reason, by using the phase difference signal U, a phase difference can be detected regardless of the amplitude value of the voltage signal and the intensity value of the optical signal input to the photoconductive light-receiving element 110.

As described above, when the phase difference changes within a range of 0 to π or π to 2π, a phase difference can be obtained uniquely from the value of the phase difference signal U.

Figure 22:
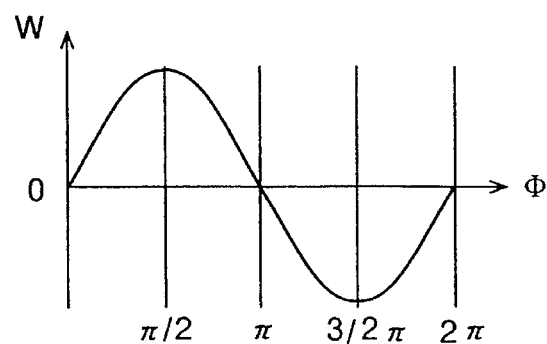
FIG. 22 is a chart for explaining the generation of the interval signal upon reception of the sine wave.

However, when the phase difference changes within a range of 0 to 2π, as is apparent from FIG. 21, two phase difference values can be obtained for one phase difference signal U. For this reason, a phase difference cannot be determined uniquely by only the above measurement operation. In this case, after the above measurement operation, the control unit 310 notifies selection designation of selection 2 to the switch 410 and the operation unit 320. In this setting, an output value from the low-pass filter 130 is obtained by replacing Φ in the value W represented by equation (12) with (Φ+π/2), as shown in a graph in FIG. 22. As is apparent from this graph, in a phase difference range of 0 to π, the value W becomes positive. In a phase difference range of π to 2/π, the value W becomes negative. The operation unit 320 receives the value W and outputs the positive/negative state of the value W as an interval signal. The conversion unit 330 receives the positive/negative information and the phase difference signal U, converts them into a unique phase difference value, and outputs a phase difference output signal as shown in FIG. 20. When a sine wave is input, as in reception of a rectangular wave, generation of an interval signal and the operation of the conversion unit 330 can be applied even when the phase difference changes within a range of 0 to π or π to 2π.

Figure 6:
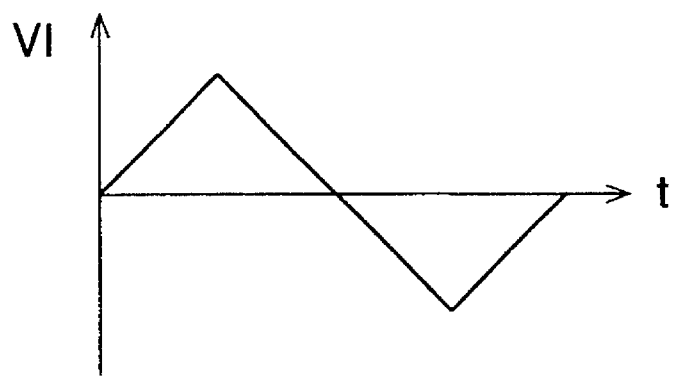
FIGS. 6 and 7 are charts for explaining applied voltage signals.
Figure 7:
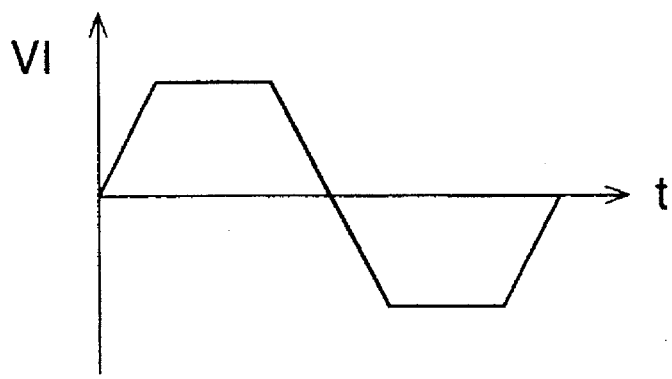

According to the apparatus of this embodiment, an input wave is not limited to the rectangular or sine wave. Even when a triangular or trapezoidal wave as shown in FIG. 6 and FIG. 7 is input, a phase difference can also be detected.

(Second Embodiment of Phase Difference Detecting Apparatus)

Figure 23:
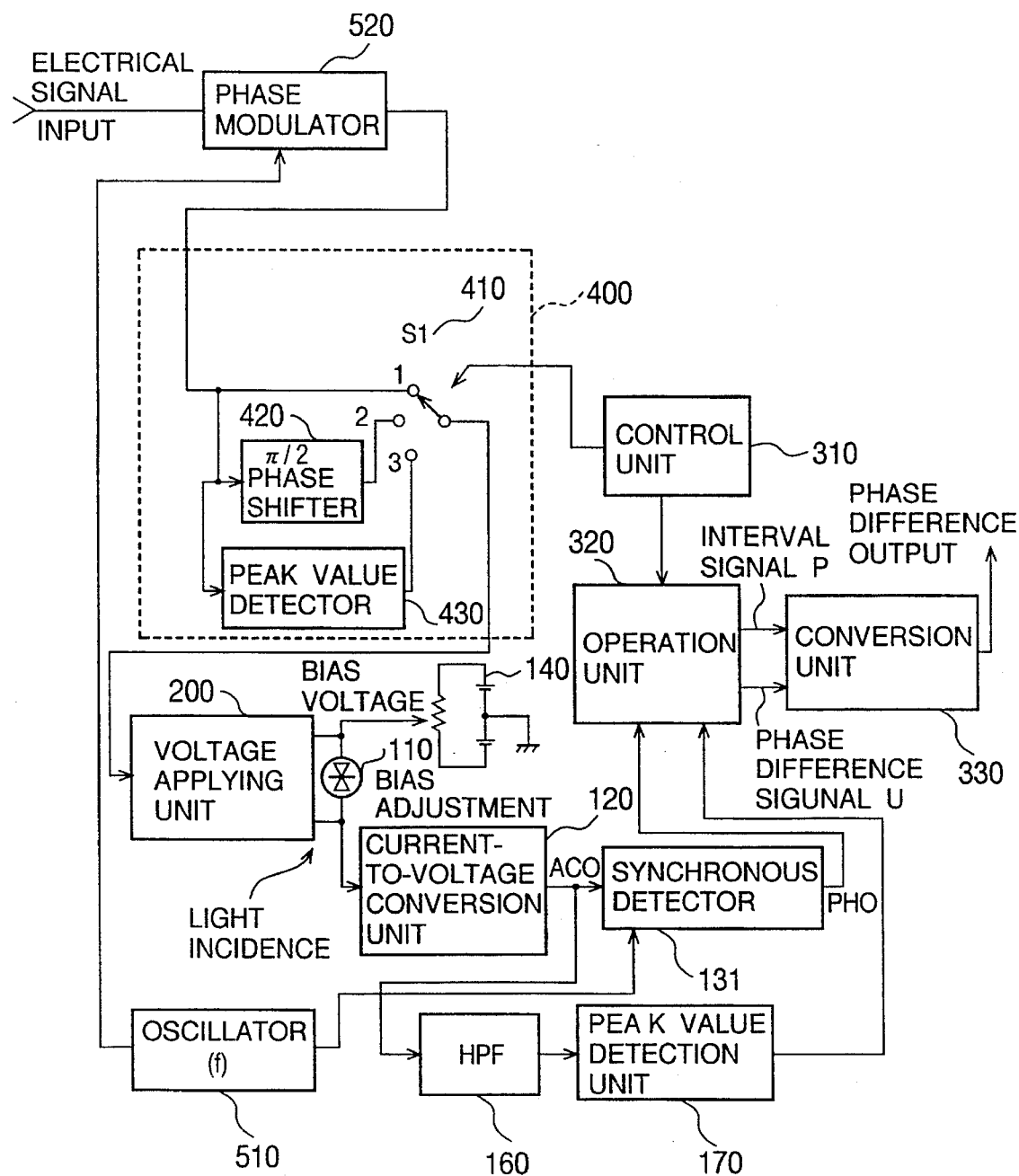
FIG. 23 is a diagram showing the arrangement of the second embodiment of the phase difference detecting apparatus of the present invention.

FIG. 23 is a diagram showing the arrangement of the second embodiment of the phase detecting apparatus of the present invention. This apparatus is constituted by, in addition to the arrangement of the phase detecting apparatus of the first embodiment, an oscillator 510 and a phase modulator 520 for receiving an electrical signal and an oscillation signal output from the oscillator 510 to output a signal obtained by phase-modulating the electrical signal with the oscillation signal to a signal selection unit 400. In addition, a low-pass filter 130 is replaced with a synchronous detector 131 for detecting an output signal from a current-to-voltage conversion unit 120 in synchronism with the oscillation signal output from the oscillator 510. The synchronous detector 131 is constituted by, e.g., a lock-in amplifier.

This apparatus operates as the phase difference detecting apparatus of the first embodiment except for the extraction operation of a DC component in synchronous detection by the synchronous detector 131, thereby detecting a phase difference. In the apparatus of this embodiment, since a phase difference is detected in synchronism with the oscillation signal generated by the oscillator 510, the S/N ratio can be increased.

The present invention is not limited to the above embodiments, and various changes and modifications can be made. The above embodiments exemplify an MSM light receiving element consisting of a GaAs material as the photoconductive light-receiving element. However, various materials (e.g., monocrystalline silicon, InP, and amorphous silicon) as proposed in "Yoshida et al.: High-Speed Silicon Switch, Applied physics, Vol. 50, No. 5, pp. 489–495" can also be used. In addition, although not adequate to a high-speed operation, a CdS cell can also be used.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims. The basic Japanese Application No. 185113 filed on Jul. 27, 1993 is hereby incorporated by reference.

What is claimed is:

1. A phase difference detecting method comprising:

the first step of applying a voltage signal which reflects a waveform of an electrical signal having a first frequency to a photoconductive light-receiving device;

the second step of receiving an optical signal modulated with the first frequency by said photoconductive light-receiving device to which the voltage signal is applied; and the third step of generating a time average value of a current flowing in said photoconductive light-receiving device in accordance with a product value of the electrical signal and the optical signal and outputting a signal which reflects an arithmetic product operation result, wherein said photoconductive light-receiving device has first and second terminals for applying the voltage signal, a resistance between said first and second terminals changes in accordance with an intensity of received light, and a voltage value at said second terminal can be set to a positive or negative value with reference to said first terminal.

2. A method according to claim 1, wherein the third step comprises:

the fourth step of converting the value of the current flowing in said photoconductive light-receiving device into a voltage value; and the fifth step of generating a time average of the voltage value.

3. A method according to claim 1, wherein, in said photoconductive light-receiving element, assuming that an incident light intensity is constant and an applying voltage is an independent variable, an amount of current flowing in said photoconductive light-receiving device represents a substantially odd function of the applying voltage within a predetermined definition range of the applying voltage value including 0 V, and assuming that the applying voltage is constant and the incident light intensity is an independent variable, the amount of current flowing in said photoconductive light-receiving device represents a substantially linear function of the incident light intensity within a predetermined definition range of the incident light itensity, and a voltage signal applied to said photoconductive light-receiving device is a periodic signal having a time average value of almost zero, and an amplitude of the voltage signal represents an even function of time when an origin is set at a central point between adjacent times where the amplitude becomes zero.

4. A phase difference detecting circuit comprising:

a photoconductive light-receiving device in which an external input voltage signal is connected to first and second terminals;

a current-to-voltage conversion circuit for converting a value of a current flowing in said photoconductive light-receiving device into a voltage value; and a time averaging circuit for receiving a voltage signal output from said current-to-voltage conversion circuit to generate a time average value, wherein, in said photoconductive light-receiving device, a resistance between said first and second terminals changes in accordance with an intensity of received light, and a voltage value at said second terminal can be set to a positive or negative value with reference to said first terminal.

5. A circuit according to claim 4, further comprising a bias adjustment circuit for adjusting an operating bias voltage to said photoconductive light-receiving device.

6. A circuit according to claim 4, wherein, in said photoconductive light-receiving device, assuming that an incident light intensity is constant and an applying voltage is an independent variable, an amount of current flowing in said photoconductive light-receiving device represents a substantially odd function of the applying voltage within a predetermined definition range of the applying voltage value including 0 V, and assuming that the applying voltage is constant and the incident light intensity is an independent variable, the amount of current flowing in said photoconductive light-receiving device represents a substantially linear function of the incident light intensity within a predetermined definition range of the incident light intensity.

7. A circuit according to claim 6, wherein said photoconductive light-receiving device is a photodetector having a metal-semiconductor-metal structure.

8. A circuit according to claim 4, wherein said time averaging circuit comprises a current-to-voltage conversion circuit for receiving an output current from said photoconductive light-receiving device and converting the input current into a voltage according to the current value, and a voltage averaging circuit for receiving a voltage signal output from said current-to-voltage conversion circuit to generate a time average of the voltage signal value.

9. A phase difference detecting apparatus comprising:

a phase difference detecting circuit according to claim 4; and voltage applying means for receiving an electrical signal having a modulation frequency of an optical signal input to a photoconductive light-receiving device to apply an applying voltage which reflects a waveform of the electrical signal to said photoconductive light-receiving device.

10. An apparatus according to claim 9, wherein, in said photoconductive light-receiving device, assuming that an incident light intensity is constant and an applying voltage is an independent variable, an amount of current flowing in said photoconductive light-receiving device represents a substantially odd function of the applying voltage within a predetermined definition range of the applying voltage value including 0 V, and assuming that the applying voltage is constant and the incident light intensity is an independent variable, the amount of current flowing in said photoconductive light-receiving device represents a substantially linear function of the incident light intensity within a predetermined definition range of the incident light intensity, and the applied voltage supplied by said voltage supplying means is a periodic signal having a time average value of almost zero, and an amplitude of the applying voltage represents an even function of time when an origin is set at a central point between adjacent times where the amplitude becomes zero.

* * * * *